(12) United States Patent
Scheinbeim

(10) Patent No.: US 6,495,642 B2
(45) Date of Patent: Dec. 17, 2002

(54) PROCESS FOR PREPARING ELECTROSTRICTIVE POLYMERS AND RESULTING POLYMERS AND ARTICLES

(75) Inventor: Jerry I. Scheinbeim, Somerset, NJ (US)

(73) Assignee: Rutgers, The State University, Piscataway, NJ (US)

( * ) Notice: Subject to any disclaimer, the term of this patent is extended or adjusted under 35 U.S.C. 154(b) by 0 days.

(21) Appl. No.: 09/797,802

(22) Filed: Mar. 5, 2001

(65) Prior Publication Data

US 2001/0039317 A1 Nov. 8, 2001

Related U.S. Application Data

(60) Provisional application No. 60/187,026, filed on Mar. 6, 2000.

(51) Int. Cl.[7] .................. C08F 214/22; C08F 214/28; H01L 41/04; H01L 41/08; H01L 41/18
(52) U.S. Cl. ............... 526/255; 310/311; 367/157; 367/160; 526/250; 526/253; 526/254
(58) Field of Search ................. 526/255, 250, 526/253, 254; 367/157, 160; 310/311

(56) References Cited

U.S. PATENT DOCUMENTS

| | | | | |
|---|---|---|---|---|
| 4,298,719 A | | 11/1981 | Mizuno et al. ............. | 526/255 |
| 4,824,911 A | * | 4/1989 | Chu ............................ | 525/199 |
| 5,052,777 A | | 10/1991 | Ninnis et al. ............... | 385/19 |
| 5,229,979 A | | 7/1993 | Scheinbeim et al. ....... | 367/157 |
| 5,307,311 A | | 4/1994 | Sliwa, Jr. .................... | 365/174 |
| 5,356,500 A | * | 10/1994 | Scheinbeim ................ | 156/229 |
| 5,374,449 A | | 12/1994 | Buhlmann et al. .......... | 427/100 |
| 6,215,231 B1 | | 4/2001 | Newhnam et al. .......... | 310/371 |
| 6,291,106 B1 | * | 9/2001 | Daido ......................... | 429/306 |

OTHER PUBLICATIONS

Science, "Giant Electrostriction and Relaxor Ferroelectric Behavior in Electron–Irradiated Poly(vinylidene fluoride–trifluoroethylene) Copolymer", By Zhang et al., vol. 280, Jun. 26, 1988, pp. 2101–2104.

1982 Ultrasonics Symposium, "Piezoelectricity of Uniaxially Oriented Polyvinylidene Fluoride", By: H. Schewe, pp. 519–524.

Japanese Journal of Applied Physics, "Electrostriction as the Origin of Piezoelectricity in Ferroelectric Polymers" By Furukawa et al., vol. 29, No. 4, Apr. 1990, pp. 675–680.

Rutgers, The State University of New Jersey, "Polarization Mechanisms in Phase II Poly(vinylidene fluoride Films", By Newman et al., vol. 16, No. 1, 1983, pp. 60–68.

Ferroelectrics 1992, "Electrostriction and Polarization", By Sundar et al., vol. 135, pp. 431–446.

Ferroelectrics 1981, A Model Theory of Piezo– and Pyroelectricity of Poly(vinylidene Fluoride) Electret, By Wada et al, vol. 32, pp. 115–118.

* cited by examiner

*Primary Examiner*—Fred Zitomer
(74) *Attorney, Agent, or Firm*—Pennie & Edmonds LLP

(57) ABSTRACT

Random copolymers including vinylidene fluoride and hexafluoropropylene that exhibit a large electrostrictive response when subjected to an electric field, articles including such polymers, and methods of preparing the polymers and articles. Electrostrictive responses greater than about 4 percent are obtainable at electric field strengths of 50 megavolts per meter.

21 Claims, 7 Drawing Sheets

PROCESS FOR PREPARING ELECTROSTRICTIVE POLYMERS AND RESULTING POLYMERS AND ARTICLES

This application claims the benefit of 60/187,026, filed Mar. 6, 2000.

The U.S. Government has a paid-up license in this invention and the right in limited circumstances to require the patent owner to license others on reasonable terms as provided for by the terms of a grant awarded by the National Science Foundation.

TECHNICAL FIELD

The present invention relates to an electrostrictive polymeric material, articles including such polymers, and a method for manufacturing the polymeric material and articles. In particular, the electrostrictive polymeric material includes a random copolymer of vinylidene fluoride and hexafluoropropylene.

BACKGROUND ART

Most polymers have electrostrictive properties to a varying degree, such that they exhibit an electric field-induced strain response. These materials undergo an elastic deformation, or strain, when exposed to an electric field, with the strain being proportional to the square of the applied field. Conversely, they can produce an electrical voltage when the electrostrictive material is subject to a deformation while in an electric field. For example, U.S. Pat. No. 4,298,719 discloses various double oriented polyvinylidene fluoride polymers that are excellent as dielectrics and reports that they have various properties including being electrostrictive.

Certain polymeric materials are known to exhibit fairly high electric field-induced strain responses. Materials exhibiting large electrostrictive strains were first observed in a polyurethane elastomer. The polyurethane elastomer exhibited strains greater than 3 percent when subjected to electric fields of up to 40 MV/m [Ma, Z. et al., High Field Electrostrictive Response of Polymers, Journal of Polymer Science: Part B, Polymer Physics, vol. 32, 2721–2731 (1994)]. An elastic modulus of about 0.01 Gpa were observed for these polyurethane elastomers Similarly, electrostrictive strains of about 4 percent have been observed under electric fields of 150 MV/m for a poly(vinylidene fluoride-trifluoroethylene) copolymer that was melt pressed, cooled stretched, and then irradiated with a high energy electron beam [Zhang, Q. M., et al., Giant Electrostriction and Relaxor Ferroelectric Behavior in Electron-Irradiated Poly (vinylidene-fluoride trifluoroethylene) Copolymer, Science, vol. 280, 2101–2104 (1998)]. The irradiated poly (vinylidene-fluoride trifluoroethylene) copolymer had an elastic modulus of approximately 0.4 Gpa.

Electrostrictive materials that exhibit high field-induced strain responses have applications in transducer, sensor, and actuator technologies; robotics; artificial muscles; and microelectrical mechanical systems (MEMS). There is, however, a need for new and improved materials that exhibit high electrostrictive strains and have improved properties, as well as methods of preparing such polymers and articles including such polymers. The present invention provides such material, processes, and articles.

SUMMARY OF THE INVENTION

The present invention is directed to an electrostrictive material that includes a random copolymer of vinylidene fluoride and hexafluoropropylene, wherein the material has a strain response of more than about 2 percent when subjected to an electrical field of at least about 30 megavolts per meter. The electrostrictive material may preferably have a strain response of more than about 3 percent when subjected to an electrical field of at least about 35 megavolts per meter or, more preferably, more than about 4 percent when subjected to an electrical field of at least about 50 megavolts per meter.

The electrostrictive material of the invention includes a copolymer of vinylidene fluoride and hexafluoropropylene and contains from about 75 to 99 mole percent vinylidene fluoride and about 25 to 1 mole percent hexafluoropropylene. In another embodiment the electrostrictive material may contain about 85 to 99 mole percent vinylidene fluoride and about 15 to 1 mole percent hexafluoropropylene or, in another embodiment, from about 90 to 99 mole percent vinylidene fluoride and about 10 to 1 mole percent hexafluoropropylene. In one preferred embodiment, the electrostrictive material contains about 95 percent vinylidene fluoride and about 5 percent hexafluoropropylene.

The electrostrictive material of the invention has a degree of crystallinity that is preferably less than about 60 percent. The Young's modulus of the electrostrictive material may be above about 0.3 Gpa, above about 0.5 Gpa, or above about 1 Gpa in various embodiments. The electrostrictive material may have a thickness strain constant, $d_t$, greater than about 500 pm/V, greater than about 1000 pm/V, or greater than about 1500 pm/V in various embodiments. The strain energy density of the electrostrictive material may be greater than about 0.1 J/cm$^3$, greater than about 0.2 J/cm$^3$, or greater than about 0.5 J/cm$^3$ in various embodiments.

In another embodiment the electrostrictive material includes a random copolymer of vinylidene fluoride and hexafluoropropylene, wherein the copolymer includes from about 85 to 99 mole percent vinylidene fluoride and from about 15 to 1 mole percent hexafluoropropylene, the material has a strain energy density greater than about 0.2, an elastic modulus greater than about 0.5, and a strain response of more than about 2 percent when subjected to an electrical field of about 30 megavolts per meter. In yet another embodiment, the electrostrictive material includes a random copolymer of vinylidene fluoride and hexafluoropropylene, wherein the copolymer includes from about 90 to 99 mole percent vinylidene fluoride and from about 10 to 1 mole percent hexafluoropropylene, the material has a strain energy density greater than about 0.8, an elastic modulus greater than about 1, and a strain response of more than about 4 percent when subjected to an electrical field of about 50 megavolts per meter.

In another embodiment of the invention, the electrostrictive material includes a random copolymer of vinylidene fluoride and hexafluoropropylene, wherein the material has a strain response of more than about 4 percent under an electrical field of between about 50 to 140 megavolts per meter.

The present invention also relates to a process for making an electrostrictive polymer and articles such as a film. The invention also relates to composite articles that include two or more films. In one embodiment the composite article includes two or more films, prepared according to the invention, wherein each film has an electrode attached to opposing sides of the films and the films are stacked on top of one another. In another embodiment of the composite two or more films, each film having an electrode attached to opposing sides of the film, are adhered to opposing sides of a semi-rigid sheet of material.

The process for forming a film includes the steps of melting a random copolymer of vinylidene fluoride and hexafluoropropylene to form a fluidized polymer; applying sufficient pressure to the fluidized polymer to remove air and form a film; releasing the pressure on the film; and cooling the film sufficiently rapidly to provide a desired strain response and a desired elastic modulus. The random copolymer may contain from about 75 to 99 mole percent vinylidene fluoride and from about 15 to 1 mole percent hexafluoropropylene. The polymer may be melted by heating the polymer to a temperature about 20° C. above its melting point and a pressure of at least about 1000 psi.

The film may be rapidly cooled by quenching it in an ice water bath, or cooled by quenching it at room temperature, or cooled at a rate of about 2° C. per minute.

BRIEF DESCRIPTION OF THE DRAWINGS

Further features and advantages of the invention can be ascertained from the following detailed description that is provided in connection with the drawing(s) described below.

DETAILED DESCRIPTION OF THE PREFERRED EMBODIMENTS

Figure 1:
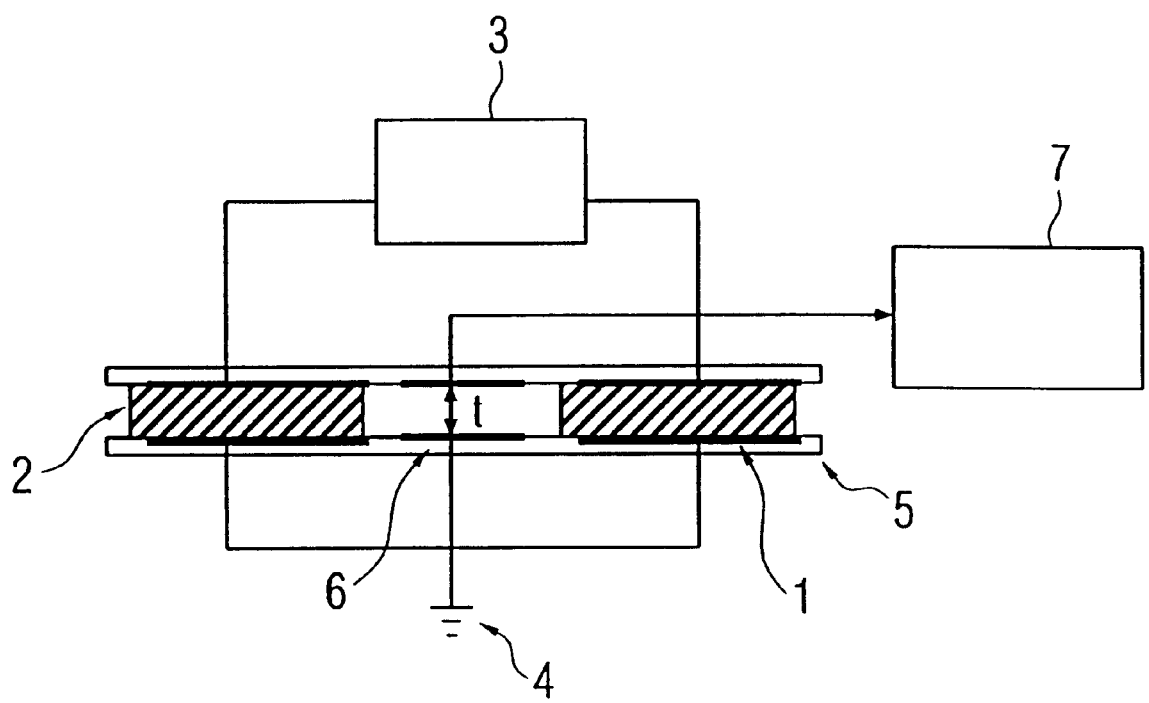
FIG. 1 is a schematic diagram of an air-gap capacitor system used to measure film thickness as a function of electric field.

The electrostrictive material of the present invention includes a random copolymer of vinylidene fluoride (VDF) and hexafluoropropylene (HFP). The material typically has a strain response of more than about 2 percent under an electrical field of at least about 30 megavolts, preferably more than about 3 percent under an electrical field of at least about 35 megavolts, and, more preferably, more than about 4 percent under an electrical field of at least about 50 megavolts per meter. Preferably, the electrostictive material of the invention has a strain response of more than about 4 percent under an electrical field of from about 50 to 140 megavolts per meter, more preferably a strain response of more than about 4 percent under an electrical field of from about 50 to 100 megavolts per meter, and most preferably a strain response of more than about 4 percent under an electrical field of from about 50 to 60 megavolts per meter.

The polymeric material contains about 75 to 99 mole percent VDF and about 25 to 1 mole percent HFP, preferably about 85 to 99 mole percent VDF and about 15 to 1 mole percent HFP, and more preferably about 90 to 99 mole percent VDF and about 10 to 1 mole percent HFP. In the most preferred embodiment, the copolymer contains about 95 percent VDF and about 5 percent HFP.

As discussed herein strain response means the change in thickness of a polymeric film relative to the original length of the film when the polymeric material is subjected to an electrical field. Strain response can be measured by any means available to one of ordinary skill in the art. For example, strain response can be measured using an air gap capacitor as described in the Examples provided below. For polymeric materials made of 95 percent VDF and about 5 percent HFP according to the invention, strain responses of greater than 4 percent are typically observed.

The polymeric materials of the present invention generally have an elastic modulus (Young's modulus) of above about 0.3 Gpa, preferably above about 0.5 Gpa, more preferably above about 0.7 Gpa, and most preferably above about 1 Gpa. Young's modulus is the ratio of stress to strain, and may be determined by any means available to those of ordinary skill in the art. Polymers having high values for Young's modulus, Y, and high values for strain response, S, are preferred, since these provide the highest stress and, thus, maximize the amount of mechanical work that can be obtained when a polymeric system prepared according to the invention is placed in an electric field.

The strain energy density, $YS^2/2$, is a property of the polymer that measures the amount of mechanical work that can be input into a system by applying an electrical field and which is then available as mechanical work when the field is turned off. Thus, high values for the strain energy density are desirable. The polymeric compositions of the present invention typically have a strain energy density greater than about 0.1 J/cm$^3$, preferably greater than about 0.2 J/cm$^3$, and more preferably greater than about 0.5 J/cm$^3$. The polymeric materials made of 95 percent VDF and about 5 percent HFP have a strain energy density of about 0.88 J/cm$^3$, which is believed to be the largest observed for any existing polymer.

The polymer of the present invention is preferably a semicrystalline polymer with a degree of crystallinity below about 60 percent, preferably below about 50 percent, and more preferably below about 40 percent. The degree of crystallinity may be, for example, between about 30 and 40 percent. The degree of crystallinity may readily be determined by any means available to those of ordinary skill in the art, such as Fourier transform infra-red (FTIR) spectroscopy or X-ray diffraction. Polymers having higher degrees of crystallinity typically have a lower strain response but a higher elastic modulus. Polymers having a low percentage of crystallinity, i.e., those below about 60 percent, are preferred due to their higher strain response.

The polymeric materials of the present invention should have a dielectric strength that is high enough to permit the full electrostrictive strain to be observed. Dielectric strength is a measure of the maximum electric field that the dielectric can maintain without electrical breakdown. Thus, it is preferable that the polymeric compositions have a dielectric strength greater than the electric field necessary to permit the full electrostrictive strain to be observed. For example, the full electrostrictive strain is observed for polymeric materials made of 95 percent VDF and about 5 percent HFP at electric fields of about 50 Mv/m. Generally, the polymeric materials of the present invention should exhibit dielectric strengths on the order of about 100 Mv/m.

In another embodiment of the invention, the thickness strain constant, $d_t$, where $d_t = dS/dE$, is greater than about 500 pm/V, preferably greater than about 1000 pm/V, and more preferably greater than about 1500 pm/V. Thickness strain constants are determined from the slopes of plots of strain vs. electric field. Polymers having a high thickness strain constant are preferred since they are capable of exhibiting the largest strain response per volt of applied electric field.

The electrostrictive materials of the present invention may be prepared by pulverizing a single polymer of VDF and HFP into a fine powder and melt pressing the powder with a hydraulic press, preferably while being heated, to form a thin film. Suitable polymers for use according to the method of the present invention are, for example, the commercially available VDF-HFP copolymers manufactured by Soltex Polymers Corp. of Woodstock, Ill. The powdered polymer can be placed between two aluminum foils and placed in a press. A film is then formed by heating the powdered polymer to a temperature above its melting point, generally from about 5 to 40° C. above the melting point, preferably from about 10 to 30° C. above the melting point, and more preferably from about 15 to 25° C. above the melting point, and subjecting the melted polymer to a sufficient pressure to remove substantially all the air from the melted polymer and form a film. Typically, the press is heated to the desired temperature and the aluminum foils containing the polymer are placed in the press. The aluminum foils containing the polymer may, however, be placed in a cool press and the temperature of the press then raised to the desired temperature. The press pressure is generally greater than about 1000 psi, preferably greater than about 2000 psi, and more preferably greater than about 3500 psi. The polymer is kept in the press under pressure for a sufficient amount of time for the polymer to melt and become a continuous film. If the polymer is left in the hot press for too long a period of time, however, the film may degrade and become discolored. Thus, the polymer is typically held in the press under pressure at the desired temperature for not more than about 20 minutes, preferably about 5 to 10 minutes. The polymeric material may then be cooled in the press, or the press may be opened and the aluminum foils containing the polymer removed. If the polymeric materials are allowed to cool in the press the rate of cooling is generally about 2° C./minute; other cooling rates, however, are also possible. When the aluminum foils containing the polymeric material are removed from the press, they can be quenched by cooling at room temperature or, preferably, by quickly placing the aluminum foils containing the polymeric material in a chilled water bath or an ice-water bath at 0° C. The aluminum foils containing the polymeric material may also be quenched at temperatures even lower than 0° C. For example, the aluminum foils containing the polymeric material may be quenched in a dry ice/acetone bath at −78° C. Quenching the aluminum foils containing the polymeric material in a bath at a temperature of less than about 0° C. is the preferred method to rapidly cool the polymer according to the invention. If the aluminum foils containing the polymeric material are quenched in an ice-water bath (or other bath) they are kept in the bath for a sufficient amount of time so that the polymeric film reaches approximately the temperature of the bath, which generally takes only a few minutes. The aluminum foils containing the polymeric material are then removed from the bath and allowed to warm up to room temperature. The aluminum foils are then removed from the polymeric film by any suitable method. For example, the aluminum foil may be peeled off of the polymeric film or may be removed by using sodium hydroxide.

The cooling process effects the properties of the polymeric material. If the aluminum foils containing the polymeric material are cooled slowly, rather than being quenched in ice-water, the resulting polymeric material has a higher degree of crystallinity and a lower strain response. Materials that are cooled slowly, however, have a higher elastic modulus. Thus, it is possible to vary the strain response and elastic modulus of the polymeric material by varying the cooling rate. Preferably, the materials are cooled rapidly to produce a polymer with a low degree of crystallinity. By rapid cooling is meant that the polymeric material is cooled from a temperature above the polymers melting point to a final temperature below the melting point such that the polymeric material crystallizes in a period of time that is less than about 2 minutes, preferably less than about 1 minute, and more preferably less than about 30 seconds. Rapid cooling may be obtained, for example, by removing the aluminum foils containing the polymeric material from the press and immediately placing the polymeric material in an ice water bath. Typically, the polymeric material crystallizes and reaches the temperature of the ice water bath within a few seconds.

Any thickness film can be made. Thicker films, however require a larger voltage to cause a strain response. Thus, thinner films are preferred. The thickness of the film is typically between about 2 and 100 $\mu$m, preferably between about 5 and 80 $\mu$m, and more preferably between about 10 and 60 $\mu$m. The films may also be formed into shapes other than a flat film. For example, the films may be in the shape of a cone. Two or more thin films may also be stacked together.

The present invention also relates to composite articles made by stacking two or more films. For example, several thin films having electrodes attached to opposing sides of each film may be stacked and the electrodes attached, in parallel, to a voltage source. Applying the electric field to each thin film produces a strain response in each film. The resulting strain is then the combined strain response of each thin film and can be used, for example, to do lifting in a mechanical device. The stacked arrangement of thin films is advantageous to a single thicker film since lower voltages are needed for thin films.

In another embodiment of the invention two thin film having electrodes attached to opposing sides are adhered to opposing sides of a semi-rigid sheet of material, such as, for example, a metal sheet or a plastic sheet. By semi-rigid sheet of material is meant a material that maintains its shape without bending but, when subject to a strain, is flexible enough that it can bend. When an electric field is applied to one of the thin films it produces a stress response that causes the polymer to get thinner and to try and spread. The stress response results in the semi-rigid sheet of material bowing since the semi-rigid sheet of material and the other thin film, which is not subject to the applied electric field, do not want to expand. By applying the electric field to the thin film on one side of the semi-rigid sheet and then to the thin film on the other side of the semi-rigid sheet in an alternating manner causes the semi-rigid sheet to bow in one direction and then in the other direction. Such an arrangement can be used, for example, as a diaphragm in a pump.

EXAMPLES

The invention is further defined by reference to the following examples describing in detail the preparation of the electrostrictive polymeric material of the present invention and the methods used to prepare the polymeric material. The examples are representative, and they should not be construed to limit the scope of the invention in any way.

Example 1
Polymeric Material Containing 95 Percent VDF and 5 Percent HFP Prepared According to the Invention A melt pressed sample of a copolymer containing 95 percent VDF and 5 percent HFP (VDF/HFP 5%) was prepared using a Carver Laboratory Press®. The copolymer was obtained from Soltex Polymers Corp., of Woodstock., Ill., as pellets and were converted into a powder by pulverizing the pellets in a Spex® Freezer Mill commercially available from Metuchen Scientific, Inc. Spex Certiprep of Metuchen, N.J. The powder was spread between two aluminum foils, melted in the press at a temperature of 190° C., and subjected to a pressure of 4,000 psi. The pressure was then reduced and the resulting composition subjected to one of three thermal treatments. The resulting composition was cooled by: (1) removing the sample from the press and rapidly quenching the sample in ice water; (2) removing the sample from the press and allowing the sample to cool at room temperature; or (3) leaving the sample in the press and allowing it to cool slowly. The resulting film in each case had a thickness of between 50 and 60 μm and was cut into strips of 3×2 cm.

Example 2
Polymeric Material Containing 85 Percent VDF and 15 Percent HFP Prepared According to the Invention A melt pressed sample of a copolymer containing 85 percent VDF and 15 percent HFP (VDF/HFP 15%) was prepared according to the process described in Example 1.

Example 3
Comparative Polyurethane Polymer

A polyurethane film, Dow 2103-80AE, provided by Deerfield Urethane Inc. of South Deerfield, Mass., was used as a comparative sample. The film had a thickness of between 50 and 60 μm and was cut into strips of 3×2 cm. Polyurethane film was chosen as a comparative polymer since polyurethane films are also known to exhibit large electrostrictive responses.

Example 4
Physical Properties of Polymeric Films Prepared According to the Invention
Strain Response Electrostrictive strains were measured as function of electric field, up to 60 Mv/m, using an air-gap capacitor (FIG. 1). Gold electrodes, 1, 30 nm in thickness, were deposited on opposing sides of the films, 2, using an EMS 650® sputter coater. One electrode was connected to a high voltage supply, 3, and the other electrode was grounded, 4. The electrode area was 2.5×1.5 cm. The film was then placed between two capacitor plates made of glass plates, 5, each having a gold electrode, 6. One electrode on the glass plate was connected to a HP 4192A Impedence Analyzer®, 7, commercially available from Hewlett-Packard Company of Palo Alto, Calif., and the other electrode was grounded, 4. The capacitance of the air gap was measured with the HP 4192A Impedence Analyzer® and then related to the strain change in the film.

The measured capacitance is related to the air-gap thickness by equation 1

$$t = \epsilon \cdot A/C \qquad \text{Eq. 1}$$

where $\epsilon$ is the permittivity of air, A is the electrode area, and C is the measured capacitance. Given the arrangement of the polymer films sandwiched between the two capacitor plates the film thickness is approximated by the gap thickness, t. Thus, the percent strain of the film is approximated by measuring the percent change of the thickness of the air gap at various electrode potentials. The system was calibrated using a 1.00 pF standard capacitor. The precision of measurements was 2 percent. The accuracy of the capacitance system was also confirmed by measuring the thickness of previously tested polyurethane films obtained from Deerfield Urethane Inc. The current system gave results that were in agreement with the previously measured thicknesses for these polyurethane films.

Figure 2:
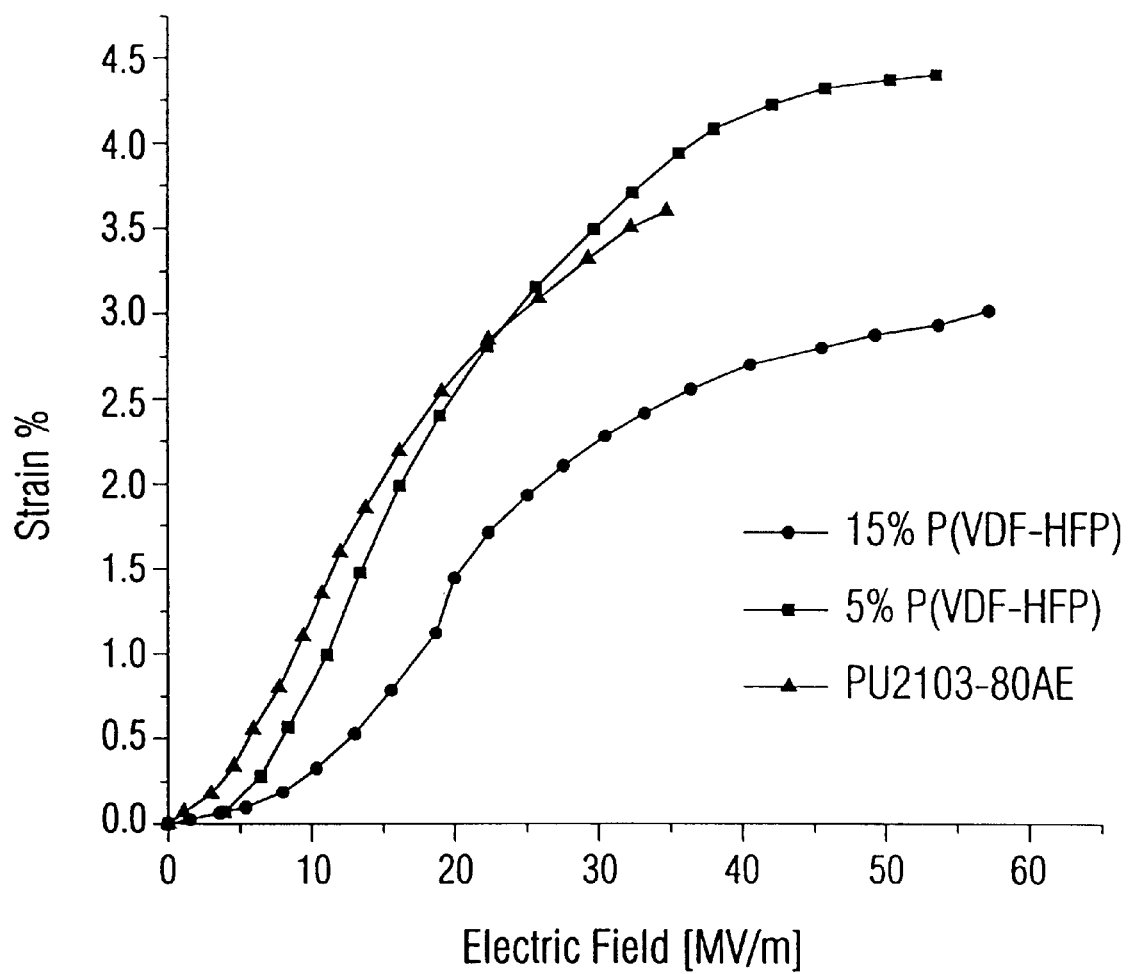
FIG. 2 is a graphical representation of strain response versus applied electric field for an ice water quenched copolymer of 95% vinylidene fluoride and 5% hexafluoropropylene, an ice water quenched copolymer of 85% vinylidene fluoride and 15% hexafluoropropylene, and for polyurethane.

FIG. 2 is a graph of strain versus electric field for electric fields up to about 60 MV/m. Polyurethane, however, could only be subjected to electric fields of up to 35 Mv/m due to the lower dielectric strength of this material. The ice water-quenched VDF/HFP 5% sample exhibited strain responses of greater than 4 percent, the largest of any sample tested. Similarly, the ice water-quenched VDF/HFP 15% sample exhibited a large strain response of greater than 3 percent.

In contrast, the slower cooled and air-quenched samples of VDF/HFP 5% and VDF/HFP 15% showed response strains of only about 1%. These results demonstrate that the thermal history of the polymeric material, i.e., the method of cooling the melted polymer, influences the strain response of the final material. The desired higher strain responses were thus obtained by rapidly cooling the melted polymeric material according to the invention.

Thickness Strain Coefficient

Figure 3:
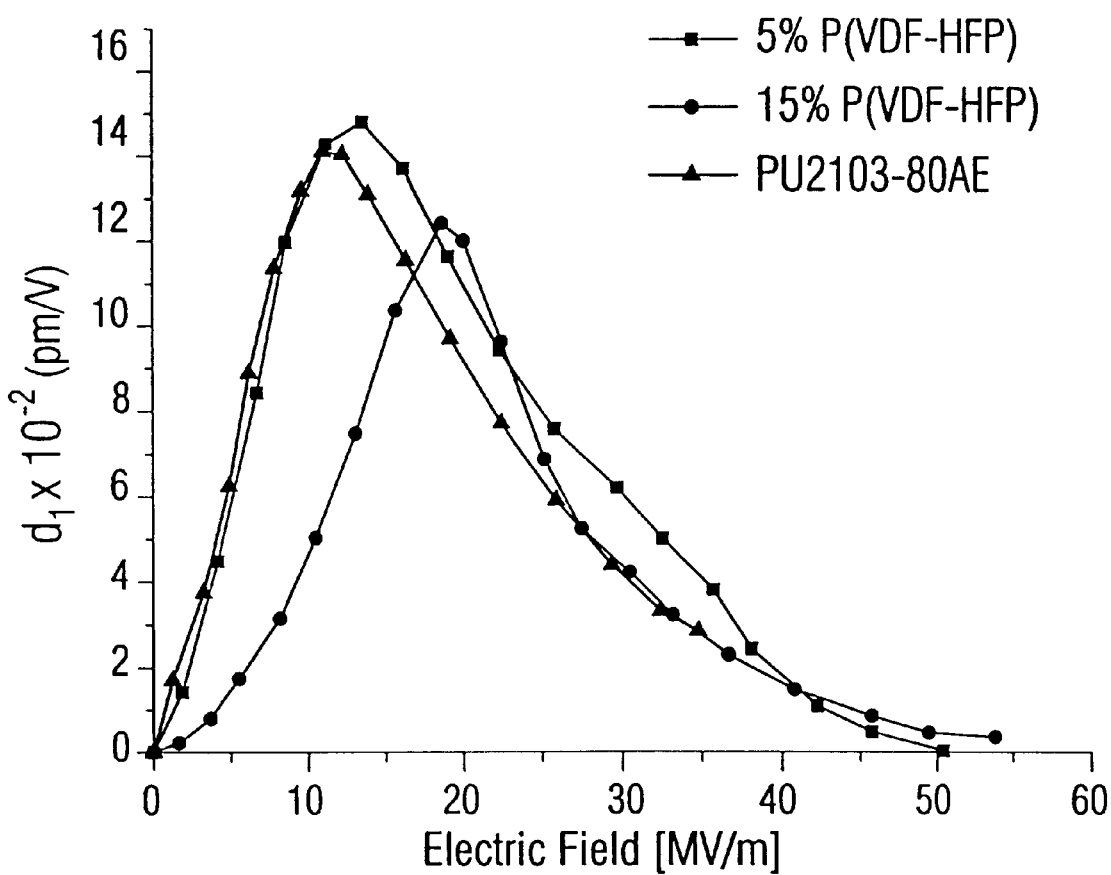
FIG. 3 is a graphical representation of thickness coefficient, $d_t$, versus electric field for an ice water quenched copolymer of 95% vinylidene fluoride and 5% hexafluoropropylene, an ice water quenched copolymer of 85% vinylidene fluoride and 15% hexafluoropropylene, and for polyurethane.

FIG. 3 shows a graph of the thickness strain coefficient, $d_t$, (i.e., the slope of the strain vs. electric field curve, FIG. 2) against electric field and indicates the regions of highest thickness response. The thickness strain coefficient, $d_t$, for the ice water-quenched VDF/HFP 5% copolymer prepared according to the invention was measured to be 1700 pm/V. This value of thickness strain coefficient is the largest of the tested samples. Moreover, the thickness strain coefficient for the ice water-quenched VDF/HFP 5% copolymer prepared according to the invention is one of the highest measured for an electrostrictive polymer and is higher than the value for the thickness strain coefficient of prior art polyvinylidene-fluoride homopolymers, poly(polyvinylidene-fluoride trifluoroethylene) copolymer, and PZT ceramics [Furukawa, T. and Seo, N., Electrostriction as the Origin of Piezoelctricity in Ferroelectric Polymers, Jpn. J. Appl. Phys., 29(4), 675 (1990) and Schewe, H., Ultrasonic Symposium Proceedings, edited by B. R. McAvoy, New York, IEEE, p. 519 (1982)]. The value of 1700 pm/V is even larger than the thickness strain coefficient of 1300 pm/V reported for the lead magnesium niobate-lead titanate (PMN-PT) system [Sundar V. and Newnham R. E., Electrostriction and Polarization, Ferroelectrics, vol. 135, 431 (1992)]. The thickness strain coefficient for the VDF/HFP 5% copolymer prepared according to the invention was also found to be substantially larger than the thickness strain coefficient for polyurethane ($d_t \approx 500$ pm/V) and other rubbers ($d_t \approx 10$ pm/V) [Ma, Y. and Reneker, D. H., Electrostriction of Rubber Sheets, Proceedings of the Fall ACS Rubber Division Meeting (Cleveland), 674–685 (1996)]. Thus, films of ice water-quenched VDF/HFP 5% copolymer prepared according to the invention have one of the highest known values for the thickness strain coefficient for an electrostrictive polymer.

Elastic Modulus, Dielectric Constant, Strain Energy Density, and Remnant Polarization The elastic modulus and relative dielectric constant were measured as a function of temperature (from −80° C. to 100° C.) at 100 Hz. The dielectric constant was also measured as a function of frequency (0.01 to 10 KHz) at room temperature. These measurements were made using a Rheolograph Solid® Toyoseiki, Japan.

Table I provides the elastic modulus, Y, the dielectric constant $\epsilon_r$, and the energy density $YS_{max}^2/2$ for the ice water-quenched VDF/HFP 5%, ice water-quenched VDF/HFP 15%, and polyurethane polymers.

TABLE I

| Material | Elastic Modulus, Y, (Gpa) | Dielectric Constant, $\epsilon_r^a$ | Strain Energy Density, $YS_{max}^2/2$, (J/cm$^3$) |
|---|---|---|---|
| Ice water quenched VDF/HFP 5% | 1.10 | 13.5 | 0.88 |
| Ice quenched VDF/HFP 15% | 0.50 | 12.7 | 0.29 |
| Polyurethane | 0.068 | 8.5 | 0.054 |

$^a$Measured at room temperature and 100 Hz.

Figure 5:
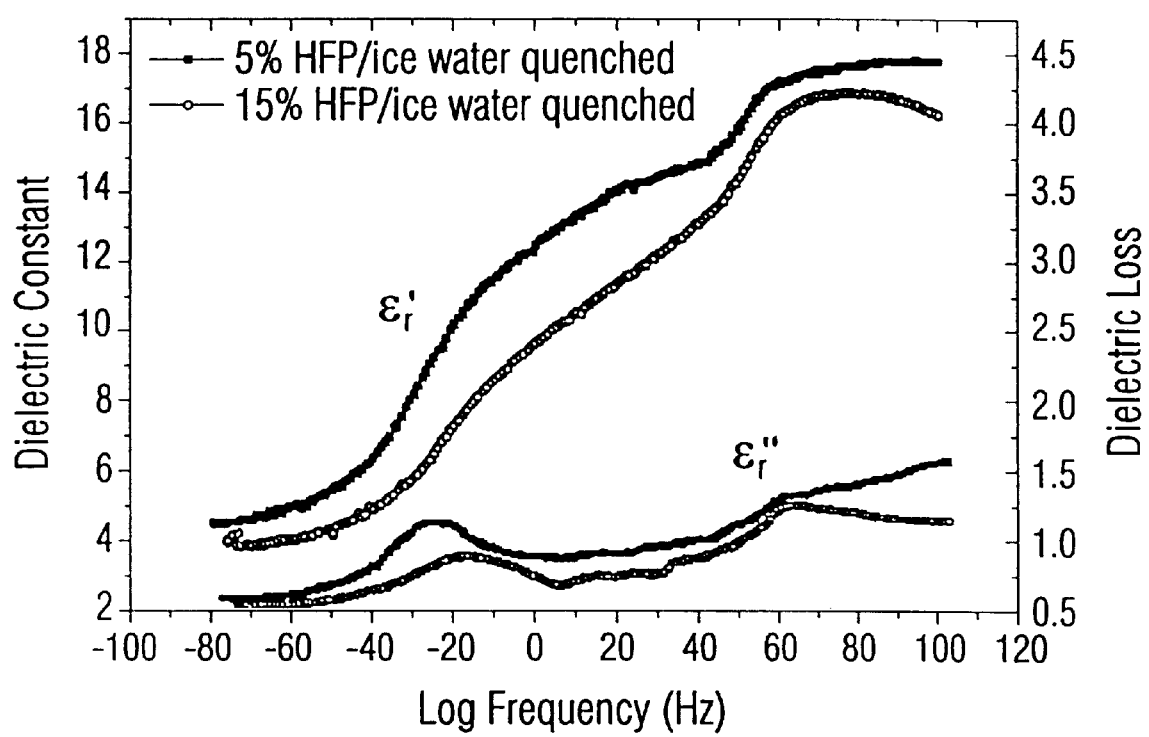
FIG. 5 is a graphical representation of dielectric constant at a measurement frequency of 104 Hz as a function of temperature for an ice water quenched copolymer of 95% vinylidene fluoride and 5% hexafluoropropylene and for an ice water quenched copolymer of 85% vinylidene fluoride and 15% hexafluoropropylene. The real part is represented by $\epsilon_r'$ and the imaginary part by $\epsilon_r''$.
Figure 6:
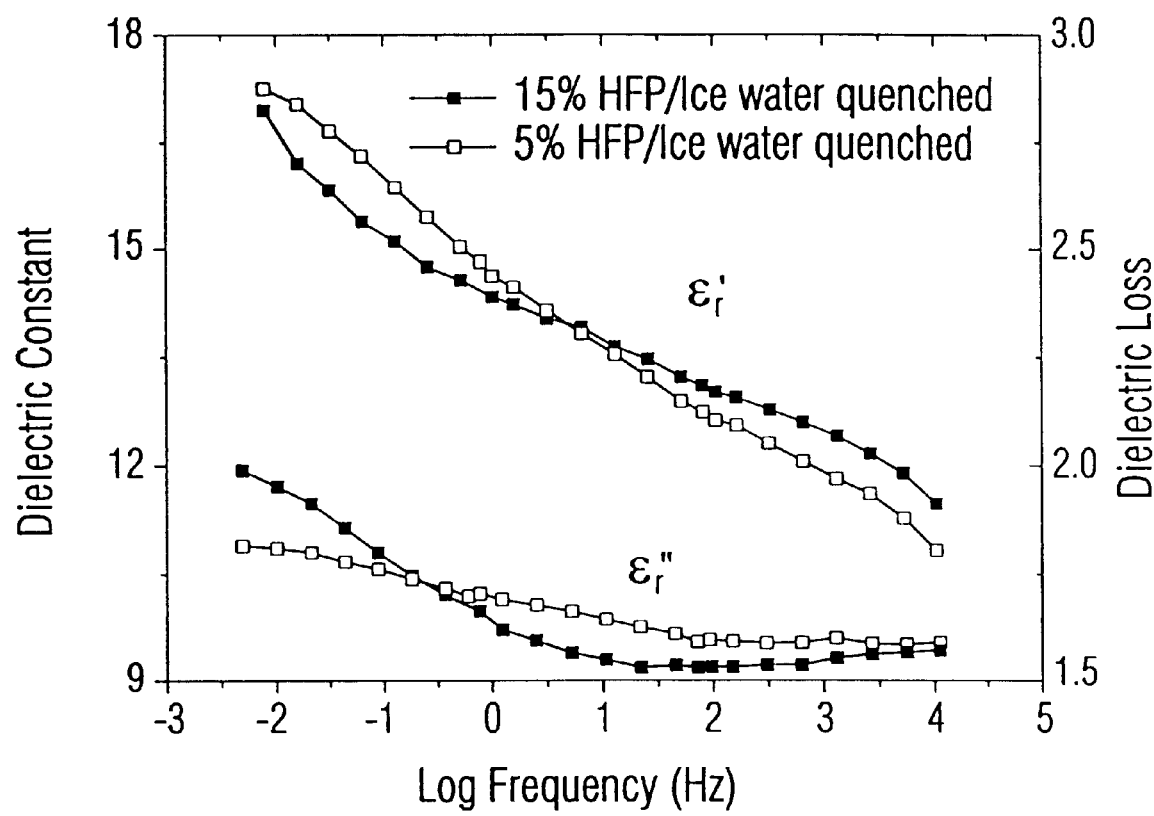
FIG. 6 is a graphical representation of dielectric constant at 20° C. as a function of frequency for an ice water quenched copolymer of 95% vinylidene fluoride and 5% hexafluoropropylene and for an ice water quenched copolymer of 85% vinylidene fluoride and 15% hexafluoropropylene. The real part is represented by $\epsilon_r'$ and the imaginary part by $\epsilon_r''$.

The data in Table I demonstrate that the electrostrictive polymeric materials of the present invention have high values for the elastic modulus, dielectric constant, and strain energy. Both ice water-quenched VDF/HFP 5% and ice water-quenched VDF/HFP 15% prepared according to the invention have a higher dielectric constant than polyurethane. The ice water-quenched VDF/HFP 5% sample showed the highest dielectric constant. The dielectric constant of the ice water-quenched VDF/HFP 5%, measured at room temperature and a frequency of 104 Hz is 13.9, was also higher than the value reported for the prior art polyvinylidenedifluoride homopolymers ($\epsilon_r \approx 12.9$) [Yasaku, W., and Reinosuke, H., Ferroelectrics, vol. 32, 115–118 (1980)] and the value reported for prior art poly(vinylidene-fluoride trifluoroethylene) copolymers ($\epsilon_r \approx 10.4$) [Furukawa, T. and Seo, N., Electrostriction as the Origin of Piezoelctricity in Ferroelectric Polymers, Jpn. J. Appl. Phys., 29(4), 675 (1990)]. FIG. 5 and FIG. 6 depict the dielectric constant as a function of temperature and frequency, respectively, for ice water-quenched VDF/HFP 5% and ice water-quenched VDF/HFP 15%. The frequency and temperature behavior of ice water-quenched VDF/HFP 5% and ice water-quenched VDF/HFP 15% prepared according to the invention are similar and are similar to that observed for prior art polyvinylidenedifluoride homopolymers.

Both the ice water-quenched VDF/HFP 5% and ice water-quenched VDF/HFP 15% exhibited high values for the elastic modulus. The elastic modulus for the ice water-quenched VDF/HFP 5% and ice water-quenched VDF/HFP 15% prepared according to the invention are higher than the elastic modulus for polyurethane. The elastic modulus for the ice water-quenched VDF/HFP 5% prepared according to the invention, determined at room temperature, is also higher than the elastic modulus for electron beam irradiated poly(vinylidene-fluoride trifluoroethylene) copolymer (Y=0.38 Gpa). The value of 1.10 is, however, lower than the elastic modulus of polyvinylidenedifluoride homopolymer and non-irradiated poly(vinylidene-fluoride trifluoroethylene) copolymer [Furukawa, T. and Seo, N., Electrostriction as the Origin of Piezoelctricity in Ferroelectric Polymers, Jpn. J. Appl. Phys., 29(4), 675 (1990). These prior art polymers, however, have undesirably lower strain responses.

Both the ice water-quenched VDF/HFP 5% and ice water-quenched VDF/HFP 15% prepared according to the invention exhibited high values for the strain energy density. The polymeric compositions of the present invention exhibit some of the highest values for strain energy density of any known polymers. The strain energy density of 0.88 J/cm$^3$ for the ice water-quenched VDF/HFP 5% is believed to be the largest observed for any existing polymer.

Figure 4:
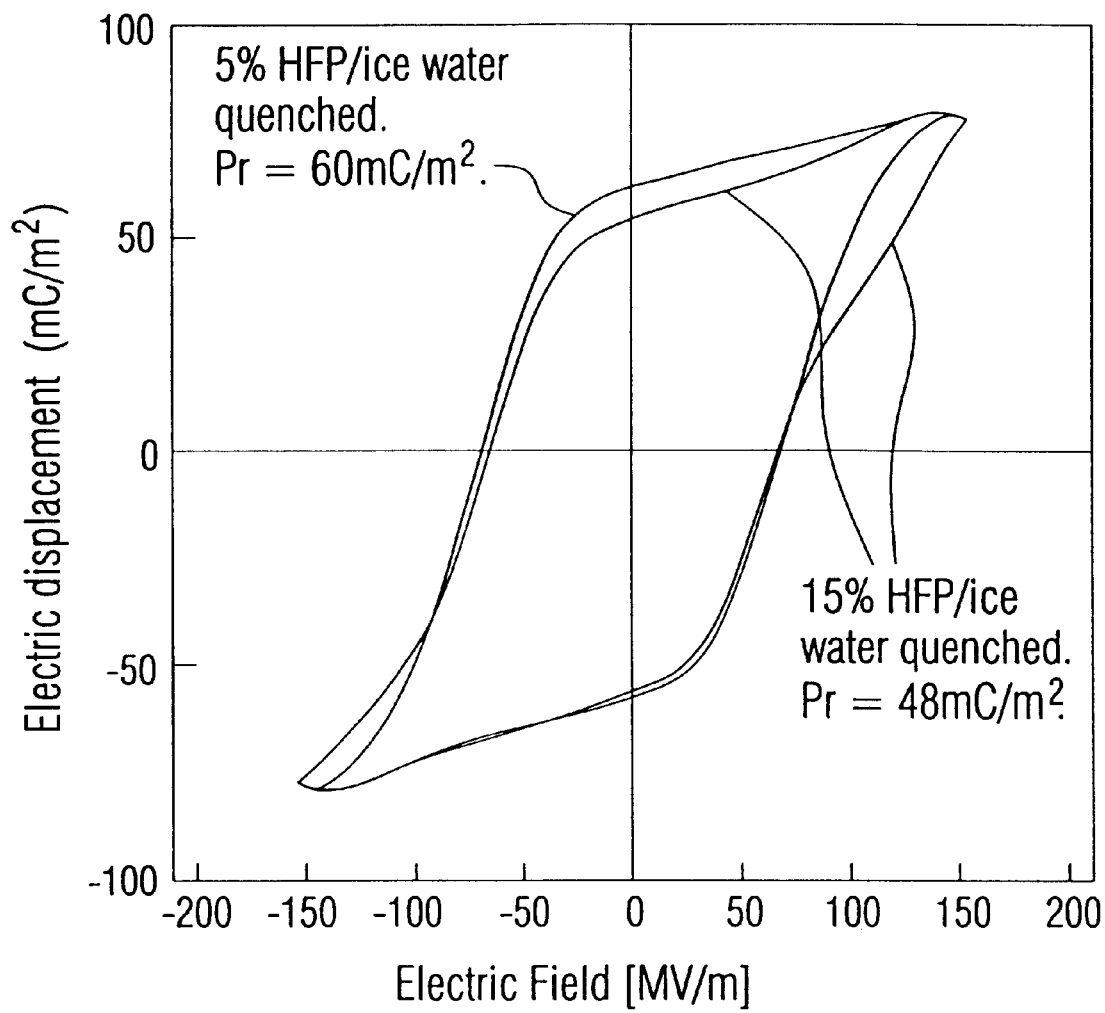
FIG. 4 is a graphical representation of electric displacement, D, as a function of electric field for an ice water quenched copolymer of 95% vinylidene fluoride and 5% hexafluoropropylene and for an ice water quenched copolymer of 85% vinylidene fluoride and 15% hexafluoropropylene.

FIG. 4 depicts the electric displacement, D, versus electric field. Only the ice water-quenched samples exhibited a remnant polarization and a D-E hysterisis loop. For the ice water-quenched VDF/HFP 5% the observed remnant polarization was 60 mC/m$^2$. For the ice water-quenched VDF/HFP 15% the observed remnant polarization was 48 mC/m$^2$. It appears, from the limited data, that only the polymeric samples that have a large electrostrictive response exhibit a D-E hysterisis loop. Values of remnant polarization and coercive field were obtained by poling the films using a Trek® high voltage source Model 610C and a Keithley® 617 electrometer and 195A digital multimeter with the aid of computer software.

Crystal Structure

X-ray diffraction patterns were obtained using a Diffraktometer Kristalloflex®, commercially available from Siemens.

Figure 7:
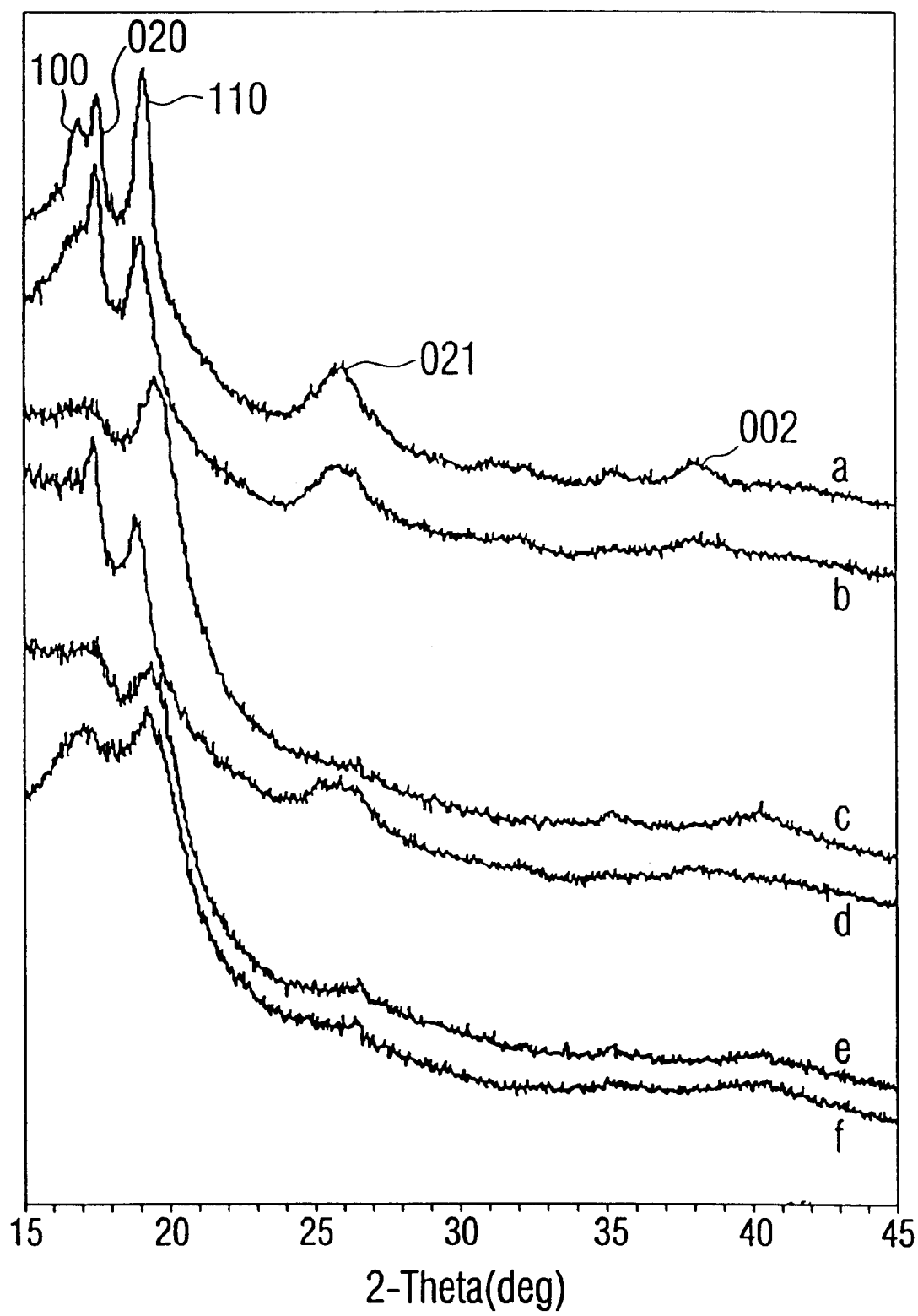
FIG. 7 is an X-ray diffraction pattern for (a) a slow cooled copolymer of 95% vinylidene fluoride and 5% hexafluoropropylene, (b) a slow cooled copolymer of 85% vinylidene fluoride and 15% hexafluoropropylene, (c) a copolymer of 95% vinylidene fluoride and 5% hexafluoropropylene cooled by quenching in air, (d) a copolymer of 85% vinylidene fluoride and 15% hexafluoropropylene cooled by quenching in air, (e) a copolymer of 95% vinylidene fluoride and 5% hexafluoropropylene cooled by quenching in ice water, and (f) a copolymer of 85% vinylidene fluoride and 15% hexafluoropropylene cooled by quenching in ice water.

X-ray diffraction patterns were performed to investigate the crystallinity and the crystal structure in the copolymer films. FIG. 7 shows wide angle diffractometer scans for slow cooled VDF/HFP 5%, slow cooled VDF/HFP 15%, air-quenched VDF/HFP 5%, air-quenched VDF/HFP 15%, ice water-quenched VDF/HFP 5%, and ice water-quenched VDF/HFP 15%. The slow cooled samples exhibited the highest crystallinity and the highest modulus while the ice water-quenched samples exhibited the lowest crystallinity and the lowest modulus. Slow cooled samples were also in the a form showing distinct (100), (020), and (110) Bragg reflections [Newman, B. and Scheinbeim, J., Polarization Mechanisms in Phase II Poly(vinylidenefluoride) Films, Macromolecules, vol. 6, 60–68 (1983)]. The (100) and (110) reflection are significantly weaker in the VDF/HFP 15% samples than in the VDF/HFP 5% samples. In the ice water-quenched samples, one can only see a combined (100) (020) broad peak with a very broad (110) peak. The VDF/HFP polymers of the present invention appear to have similar Bragg reflections as those observed for poly (vinylidenefluoride), however, the intensity of the Bragg reflections differ.

The invention described and claimed herein is not to be limited in scope by the specific embodiments herein disclosed, since these embodiments are intended as illustrations of several aspects of the invention. Any equivalent embodiments are intended to be within the scope of this invention. Indeed, various modifications of the invention in addition to those shown and described herein will become apparent to those skilled in the art from the foregoing description. Such modifications are also intended to fall within the scope of the appended claims.

What is claimed is:

1. An electrostrictive material comprising a random copolymer of about 75 to 99 mole percent vinylidene fluoride and 25 to 1 mole percent hexafluoropropylene, wherein the material has a strain response of more than about 2 percent under an electrical field of at least about 30 megavolts per meter.

2. The electrostrictive material of claim 1 wherein the material has a strain response of more than about 3 percent under an electrical field of at least about 35 megavolts per meter.

3. The electrostrictive material of claim 1 wherein the material has a strain response of more than about 4 percent under an electrical field of at least about 50 megavolts per meter.

4. The electrostrictive material of claim 1, wherein the copolymer comprises about 85 to 99 mole percent vinylidene fluoride and about 15 to 1 mole percent hexafluoropropylene.

5. The electrostrictive material of claim 1, wherein the copolymer comprises about 90 to 99 mole percent vinylidene fluoride and about 10 to 1 mole percent hexafluoropropylene.

6. The electrostrictive material of claim 5, wherein the copolymer comprises about 95 percent vinylidene fluoride and about 5 percent hexafluoropropylene.

7. The electrostrictive material of claim 1 having a degree of crystallinity that is less than about 60 percent.

8. The electrostrictive material of claim 1, wherein the material has a Young's modulus of at least about 0.3 Gpa.

9. The electrostrictive material of claim 8, herein the material has a Young's modulus of at least about 0.5 Gpa.

10. The electrostrictive material of claim 9, wherein the material has a Young's modulus of at least about 1 Gpa.

11. The electrostrictive material of claim 1, wherein the material has a thickness strain constant, $d_t$, of at least about 500 pm/V.

12. The electrostrictive material of claim 11, wherein the material has a thickness strain constant, $d_t$, of at least about 1000 pm/V.

13. The electrostrictive material of claim 11, wherein the material has a thickness strain constant, $d_t$, of at least about 1500 pm/V.

14. The electrostrictive material of claim 1, wherein the material has a strain energy density of at least about 0.1 $J/cm^3$.

15. The electrostrictive material of claim 14, wherein the material has a strain energy density of at least about 0.2 $J/cm^3$.

16. The electrostrictive material of claim 15, wherein the material has a strain energy density of at least about 0.5 $J/cm^3$.

17. An electrostrictive material comprising a random copolymer of about 85 to 99 percent vinylidene fluoride and about 15 to 1 mole percent hexafluoropropylene, wherein the material has an elastic modulus of at least about 0.5 and a strain response of at least about 2 percent under an electrical field of about 30 megavolts per meter.

18. An electrostrictive material comprising a random copolymer of about 90 and 99 mole percent vinylidene fluoride and about 10 and 1 mole percent hexafluoropropylene, wherein the material has an elastic modulus of at least about 1, and a strain response of at least about 4 percent under an electrical field of about 50 megavolts per meter.

19. A film comprising the electrostrictive material of claim 1.

20. A composite article comprising two or more films prepared according to claim 19 wherein each film has an electrode attached to opposing sides of the films and the films are stacked on top of one another.

21. A composite articles comprising two or more films prepared according to claim 19 wherein each film has an electrode attached to opposing sides of the films and the films are adhered to opposing sides of a semi-rigid sheet of material.

* * * * *